United States Patent
Aaltonen

(10) Patent No.: US 11,650,055 B2
(45) Date of Patent: May 16, 2023

(54) MEMS GYROSCOPE SENSITIVITY COMPENSATION

(71) Applicant: MURATA MANUFACTURING CO., LTD., Nagaokakyo (JP)

(72) Inventor: Lasse Aaltonen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 109 days.

(21) Appl. No.: 17/193,436

(22) Filed: Mar. 5, 2021

(65) Prior Publication Data

US 2021/0278213 A1 Sep. 9, 2021

(30) Foreign Application Priority Data

Mar. 9, 2020 (FI) .................................. 20205246

(51) Int. Cl.
*G01C 19/5726* (2012.01)
*B81B 7/02* (2006.01)
(Continued)

(52) U.S. Cl.
CPC ............ *G01C 19/5726* (2013.01); *B81B 7/02* (2013.01); *G01C 19/5712* (2013.01); *G01C 19/5776* (2013.01); *B81B 2201/0242* (2013.01)

(58) Field of Classification Search
CPC ............ G01C 19/5712; G01C 19/5776; G01C 19/5726; G01C 19/5719; B81B 7/008; B81B 7/02; B81B 3/0018; B81B 3/0021
See application file for complete search history.

(56) References Cited

U.S. PATENT DOCUMENTS 5,703,292 A * 12/1997 Ward ..................... H03F 1/083
73/504.16
5,847,396 A 12/1998 Lingren et al.
(Continued)

FOREIGN PATENT DOCUMENTS

EP 3249357 A1 11/2017
EP 3754300 A1 12/2020
(Continued)

OTHER PUBLICATIONS

Office Action dated Jun. 28, 2022, corresponding to Japanese Patent Application No. 2021-020198.
(Continued)

*Primary Examiner* — Helen C Kwok
(74) *Attorney, Agent, or Firm* — Squire Patton Boggs (US) LLP

(57) ABSTRACT

A MEMS gyroscope and a method for compensating drift of sensitivity of a MEMS gyroscope are disclosed. The method comprises demodulating an angular rate signal with an in-phase carrier signal for producing a raw rate signal, and obtaining a DC test signal The DC test signal is filtered for obtaining a raw test signal, and zeroing offset of the raw test signal is performed by comparing each sample of the raw test signal to a test signal normalization value for producing an offset zeroed test signal that represents a deviation of the sample of the raw test signal from the test signal normalization value. A sensitivity compensation multiplier is determined based upon the offset zeroed test signal and a predefined gain coefficient, and drift of sensitivity is compensated by multiplying the raw rate signal with the sensitivity compensation multiplier for providing a sensitivity compensated rate signal.

14 Claims, 9 Drawing Sheets

(51) Int. Cl.
  *G01C 19/5712* (2012.01)
  *G01C 19/5776* (2012.01)

(56) References Cited

U.S. PATENT DOCUMENTS

| | | | | |
|---|---|---|---|---|
| 6,626,039 | B1* | 9/2003 | Adams | G01C 19/5719 |
| | | | | 73/504.04 |
| 9,575,089 | B1* | 2/2017 | Cazzaniga | G01C 19/5719 |
| 9,846,037 | B2 | 12/2017 | Aaltonen | |
| 11,320,265 | B2* | 5/2022 | Aaltonen | B81B 3/0018 |
| 2006/0009946 | A1* | 1/2006 | Betz | G01C 19/56 |
| | | | | 702/145 |
| 2006/0065038 | A1* | 3/2006 | Morell | G01C 19/5776 |
| | | | | 73/1.37 |
| 2006/0174684 | A1* | 8/2006 | Betz | G01C 19/56 |
| | | | | 73/1.37 |
| 2006/0272386 | A1* | 12/2006 | Mayer-wegellin | |
| | | | | G01C 19/5776 |
| | | | | 73/1.37 |
| 2011/0192226 | A1* | 8/2011 | Hayner | G01C 19/5776 |
| | | | | 73/504.12 |
| 2013/0269413 | A1* | 10/2013 | Tao | G01C 25/00 |
| | | | | 73/1.38 |
| 2015/0377622 | A1* | 12/2015 | Waters | G01P 15/125 |
| | | | | 73/504.12 |
| 2017/0023364 | A1 | 1/2017 | Gregory | |
| 2017/0343351 | A1 | 11/2017 | Törmälehto | |
| 2019/0178645 | A1* | 6/2019 | Senkal | G01C 19/5712 |
| 2019/0277656 | A1* | 9/2019 | Painter | G01C 25/005 |
| 2019/0298235 | A1 | 10/2019 | Miltner et al. | |
| 2019/0310106 | A1 | 10/2019 | Furuta et al. | |

FOREIGN PATENT DOCUMENTS

| | | |
|---|---|---|
| JP | 20140174167 A | 9/2014 |
| JP | 20140174175 A | 9/2014 |
| JP | 20190505769 A | 2/2019 |

OTHER PUBLICATIONS

Finnish Search Report dated Oct. 8, 2020 corresponding to Finnish Patent Application No. 20205246.
European Search Report dated Jun. 25, 2021 corresponding to European Patent Application No. 21155932.

* cited by examiner

MEMS GYROSCOPE SENSITIVITY COMPENSATION

FIELD

The present invention relates to a method and an apparatus related to microelectromechanical (MEMS) gyroscopes. More particularly, the invention relates to compensating slow changes in sensitivity of a MEMS gyroscope.

BACKGROUND

Motion can be considered to have six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitively, piezoelectrically or piezoresistively sensing structure.

In MEMS gyroscopes the primary motion is typically not continuous rotation as in conventional gyroscopes due to lack of adequate bearings. Instead, mechanical oscillation may be used as the primary motion. When an oscillating gyroscope is subjected to an angular motion, an undulating Coriolis force results. This creates a secondary oscillation motion orthogonal to the primary motion and to the axis of the angular motion, and at the frequency of the primary oscillation. The amplitude of this coupled secondary oscillation motion can be used as the measure of the angular motion.

MEMS gyroscopes are used in many critical systems, especially in automotive industry, so built-in functionality diagnostics that provides information on critical internal variations of MEMS gyroscopes is essential. A known diagnostics method that provides good ability for detecting errors occurring within the MEMS gyroscope is continuous self-testing.

For example, navigation applications, in particular self-navigation applications require very high precision from the gyroscopes providing information about the movement of a vehicle. MEMS gyroscope devices used for such high precision applications often need to be individually trimmed after manufacturing to ensure accuracy. Trimming enables canceling variation between individual units caused for example by common manufacturing process inaccuracies. However, even small changes occurring in the device during its lifetime may cause reduction of detection accuracy that is not acceptable either. A line of advanced vibratory gyroscopes applies a closed-loop system where the vibrational sense motion is feedback controlled for enhanced performance.

The FIG. 1 shows an exemplary cross-section MEMS gyroscope structure in which parallel plate capacitors used as drive and detector elements. Measures in the drawing are not in scale but adjusted to facilitate visualization. A parallel plate capacitor is provided between a rotor (120) and an electrode (130), both electrically coupled (not shown) to a transducer (not shown). For detection function, the transducer converts a detected capacitance into an electrical signal. In this example the MEMS gyroscope is designed to utilize out-of-plane motion of the rotor (120) so that vertical oscillating motion of the rotor (120) modulates a vertical gap (x) of the respective drive or sense transducer capacitor, wherein the vertical gap (x) is formed between the rotor (120) and the electrode (130). The transducer is sensitive to any parasitic effects that affect the gap (x).

Here capacitance of a plate capacitor is of the form $$C(x) = \frac{\varepsilon_0 A}{x} = \frac{\varepsilon_0 A}{x_0 - x_m}$$

where $\varepsilon_0$ is relative permittivity of vacuum, x is the width of the gap, comprising both a constant gap $x_0$ measured when the rotor is not excited by any external forces, and the motion modulated gap ($x = x_0 - x_m$), and A is the area of the capacitor. On the other hand, for driving operation, also referred to as actuation operation, an electrical signal is used for charging the capacitor, which creates an electrostatic force that is used for driving the rotor (120) into a motion. The electrostatic force Fc on the capacitor can be calculated as follows:

$$Fc(x, V) = -\frac{\varepsilon_0 A}{2x^2} V^2$$

The force is thus affected by both the width of the gap (x) and a voltage (V) across the air gap. In the two equations above, the gap (x) can be seen to affect the value of both the capacitance and the electrostatic force. This voltage (V) may comprise a DC voltage part $V_{DC}$ and a modulated voltage part $V_{AC}$ ($V = V_{DC} + V_{AC}$). The modulated voltage part $V_{AC}$ may be utilized for generating an oscillating force on a wanted AC frequency.

In a closed-loop gyroscope, angular rate sensitivity $RATE_{SENSITIVITY}$, herein referred also in short as sensitivity depends approximately inversely on the electrostatic force Fc:

$$RATE_{SENSITIVITY} \sim \frac{1}{Fc}$$

For angular rate sensor, sensitivity indicates relation between an output signal and a detected angular rate. For example, for angular rate sensor providing output as voltage, the angular rate sensitivity indicates the relation between change in output voltage and detected angular rate, and for an angular rate sensor providing output as a digital signal, the angular rate sensitivity—in short sensitivity—may be expressed as least significant bit (LSB) per degrees of rotation in a time period, for example degrees in second (LSB/dps) or degrees in hour (LSB/dph). In this connection, the term least significant bit (LSB) refers to smallest possible quantity of signal change when the signal is represented digital format. In practice, as small as nanometer-scale instabilities in the width of the gap or millivolt-level errors in the voltage V may cause excessive shifts in the sensitivity of the gyroscope. Thus, a sensitivity compensation mechanism is needed.

DESCRIPTION OF THE RELATED ART

Patent application FI20195537 discloses a continuous self-test method of a MEMS gyroscope, in which a self-test signal comprising two distinctive fundamental frequencies is fed into the secondary loop of the MEMS gyroscope.

U.S. Pat. No. 9,846,037 discloses a continuous self-test in a vibratory gyroscope in which at least one test input signal is generated from a signal of the vibrational primary motion.

SUMMARY

An object is to provide a method and apparatus so as to solve the problem of compensating changes in a MEMS gyroscope sensitivity. The term sensitivity refers here to angular rate sensitivity. The objects of the present invention are achieved with a method according to the claim 1. The objects of the present invention are further achieved with a MEMS gyroscope according to the claim 8.

The preferred embodiments of the invention are disclosed in the dependent claims.

According to a first aspect, a method for compensating drift of sensitivity of a MEMS gyroscope is provided. The method comprises demodulating an angular rate signal with an in-phase carrier signal for producing a raw rate signal, wherein the angular rate signal comprises a test signal component comprising at least one test frequency, and wherein the at least one test frequency deviates from a nominal frequency of the MEMS gyroscope. The method also comprises obtaining a raw DC test signal by processing the angular rate signal or by further processing the raw rate signal, and low pass filtering the DC test signal for obtaining a raw test signal. The method further comprises zeroing offset of the raw test signal by comparing each sample of the raw test signal to a test signal normalization value for producing an offset zeroed test signal representing a deviation of the sample of the raw test signal from the test signal normalization value, determining a sensitivity compensation multiplier on basis of the offset zeroed test signal and a predefined gain coefficient, and compensating drift of sensitivity by multiplying the raw rate signal with the sensitivity compensation multiplier for providing a sensitivity compensated rate signal.

According to a second aspect, the sensitivity compensation multiplier is defined by equation $$\frac{1}{1-((V_{TEST\_COMP}-V_{TEST}(i))/V_{TEST\_COMP})*K0}$$

or by equivalent equation $$\frac{1}{1-(V_{TEST\_COMP}-V_{TEST}(i))*K0/V_{TEST\_COMP}}$$

wherein $V_{TEST\_COMP}$ is the test signal normalization value, $V_{TEST}(i)$ is the current sample of the raw test signal, $((V_{TEST\_COMP}-V_{TEST}(i))/V_{TEST\_COMP})$ or $(V_{TEST\_COMP}-V_{TEST}(i))$ is the respective offset zeroed test signal and K0 is the predefined gain coefficient According to a third aspect, the method comprises low pass filtering the offset zeroed test signal before determining the sensitivity compensation multiplier.

According to a fourth aspect, the method comprises comparing each sample of the offset zeroed test signal to an offset threshold value, and discarding the sample when the offset is equal to or greater than the offset threshold value or adding the sample to a first-in-first-out queue when the offset is less than the offset threshold value and using samples in the first-in-first-out queue as the offset zeroed test signal.

According to a fifth aspect, said further processing the raw rate signal comprises multiplying the raw rate signal with a test carrier signal for producing the DC test signal.

According to a sixth aspect, said processing the angular rate signal comprises, if the test signal component comprises an amplitude modulated test signal comprising at least two test frequencies, performing steps of a) demodulating the angular rate signal using a quadrature-phase carrier signal, and b) multiplying the demodulated angular rate signal with a test signal carrier signal for obtaining a DC test signal, or, if the test signal component comprises includes a single test frequency, performing step b) multiplying the angular rate signal with a test signal carrier signal for obtaining a DC test signal.

According to a seventh aspect, the method further comprises phase trimming the quadrature-phase carrier signal for mitigating effects of phase shift of the at least one test frequency in the MEMS gyroscope, and using the phase-trimmed quadrature-phase carrier signal for demodulation in the step a).

According to an eighth aspect, the method further comprises demodulating the angular rate signal using the quadrature-phase carrier signal for producing a quadrature control signal.

According to a ninth aspect, the method further comprises low pass filtering the sensitivity compensated rate signal for producing a continuous sensitivity compensated rate signal.

According to a first apparatus aspect, a MEMS gyroscope is provided that comprises circuitry configured to compensate drift of the MEMS gyroscope's own sensitivity. The circuitry of the MEMS gyroscope comprises a first demodulator configured to demodulate an angular rate signal with an in-phase carrier signal for producing a raw rate signal, wherein the angular rate signal comprises a test signal component comprising at least one test frequency, and wherein the at least one test frequency deviates from a nominal frequency of the MEMS gyroscope. The circuitry further comprises a circuitry configured to process the angular rate signal or to further process the raw rate signal for obtaining a DC test signal, a first low-pass filter configured to filter the DC test signal for obtaining a raw test signal and an offset zeroing circuitry configured to zero offset of the raw test signal by comparing each sample of the raw test signal to a test signal normalization value for producing an offset zeroed test signal representing a deviation of the sample of the raw test signal from the test signal normalization value. The circuitry further comprises a sensitivity compensation circuitry configured to determine a sensitivity compensation multiplier on basis of the offset zeroed test signal and a predefined gain coefficient, and to multiply the raw rate signal with the sensitivity compensation multiplier for providing a sensitivity compensated rate signal.

According to a second apparatus aspect, the sensitivity compensation multiplier is defined by equation $$\frac{1}{1-((V_{TEST\_COMP}-V_{TEST}(i))/V_{TEST\_COMP})*K0}$$

or by equivalent equation $$\frac{1}{1-(V_{TEST\_COMP}-V_{TEST}(i))*K0/V_{TEST\_COMP}}$$

wherein $V_{TEST\_COMP}$ is the test signal normalization value, $V_{TEST}(i)$ is the current sample of the raw test signal, $((V_{TEST\_COMP} - V_{TEST}(i))/V_{TEST\_COMP})$ or $(V_{TEST\_COMP} - V_{TEST}(i))$ is the respective offset zeroed test signal and K0 is the predefined gain coefficient According to a third aspect, the method comprises low pass filtering the offset zeroed test signal before determining the sensitivity compensation multiplier.

According to a third apparatus aspect, the MEMS gyroscope comprises a second low-pass filter configured to low-pass filter the offset zeroed test signal before determining the sensitivity compensation multiplier.

According to a fourth apparatus aspect, the MEMS gyroscope further comprises an IF & FIFO circuitry configured to compare each sample of the offset zeroed test signal to an offset threshold value, to discard a sample when the offset is equal to or greater than the offset threshold value, and to add the sample to a first-in-first-out queue when the offset is less than the offset threshold value. Samples in the first-in-first-out queue are configured to be used as the offset zeroed test signal.

According to a fifth apparatus aspect, said circuitry configured to process the raw rate signal for obtaining the raw test signal comprises a first multiplier configured to multiply the raw rate signal with a test carrier signal for producing the DC test signal.

According to a sixth apparatus aspect, if the test signal component comprises an amplitude modulated test signal comprising at least two test frequencies, said circuitry configured to process the angular rate signal for obtaining the raw test signal comprises a second demodulator configured to demodulate the angular rate signal using a quadrature-phase carrier signal and a first multiplier configured to multiply the demodulated angular rate signal with a test signal carrier signal for obtaining a DC test signal, or, if the test signal component includes a single test frequency, said circuitry configured to process the angular rate signal for obtaining the raw test signal comprises the first multiplier configured to multiply the angular rate signal with a test signal carrier signal for obtaining a DC test signal.

According to a seventh apparatus aspect, the MEMS gyroscope further comprises a phase trimming circuitry configured to phase trim the quadrature-phase carrier signal for mitigating effects of phase shift of the at least one test frequency in the MEMS gyroscope, and to provide the phase phase-trimmed quadrature-phase carrier signal to the second demodulator.

According to an eighth apparatus aspect, the MEMS gyroscope further comprises a third demodulator configured to demodulate the angular rate signal using the quadrature-phase carrier signal for producing a quadrature control signal.

According to a ninth apparatus aspect, the MEMS gyroscope further comprises a third low-pass filter configured to low-pass filter the sensitivity compensated rate signal for producing a continuous sensitivity compensated rate signal.

The present invention is based on a finding of correlation between frequency dependency of a closed-loop small signal gain and/or phase of a gyroscope and angular rate sensitivity. Similar correlation is also found in small signal gain and/or phase of an open-loop gyroscope. The invention is then implemented by using a test signal that enables detection of a change in gain and/or phase shift of a test signal and using this test signal for determining a gain coefficient that enables compensating sensitivity variations caused by at least one of temperature variations and device life-time associated, relatively slowly acting mechanisms, such as stress effects due to humidity variation, long exposures to maximum temperatures, and/or instability of environment in which the MEMS gyroscope is used, for example stress effects spreading via a PCB on which the MEMS gyroscope device is soldered on. Such slow change of the angular rate sensitivity may be referred to as angular rate sensitivity drift, or in short as sensitivity drift. Frequency of the test signal(s) is/are preferably selected such that changes in the test signal(s) are as strong as possible.

The present invention has the advantage that it improves accuracy of the angular rate measurements. The improvement is particularly useful for improving drifting of the angular rate sensor accuracy due to long term error mechanisms.

BRIEF DESCRIPTION OF THE DRAWINGS

In the following the invention will be described in greater detail, in connection with preferred embodiments, with reference to the attached drawings, in which.

DETAILED DESCRIPTION

Figure 1:
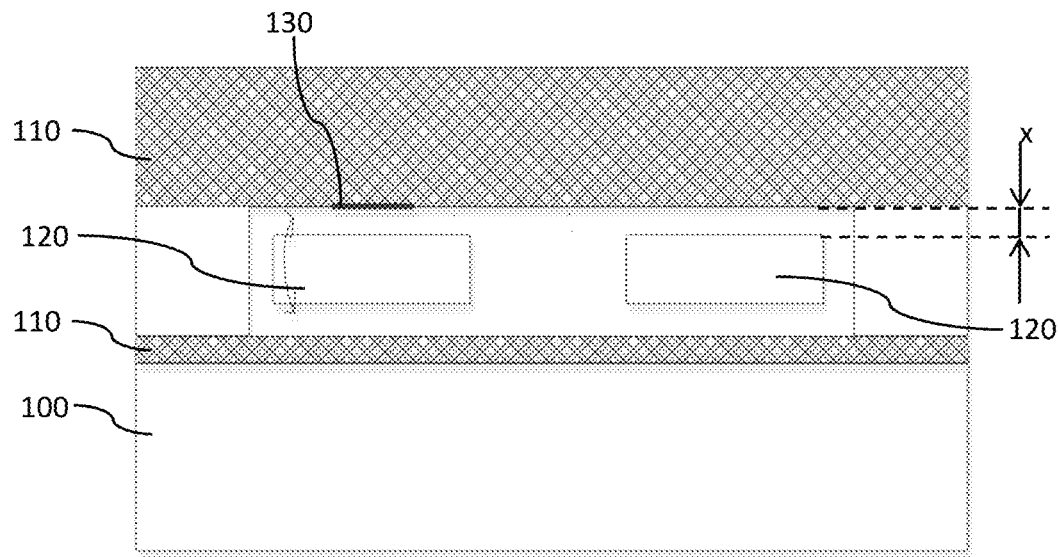
FIG. 1 is an exemplary cross-section MEMS gyroscope structure with parallel plate capacitors.
Figure 2:
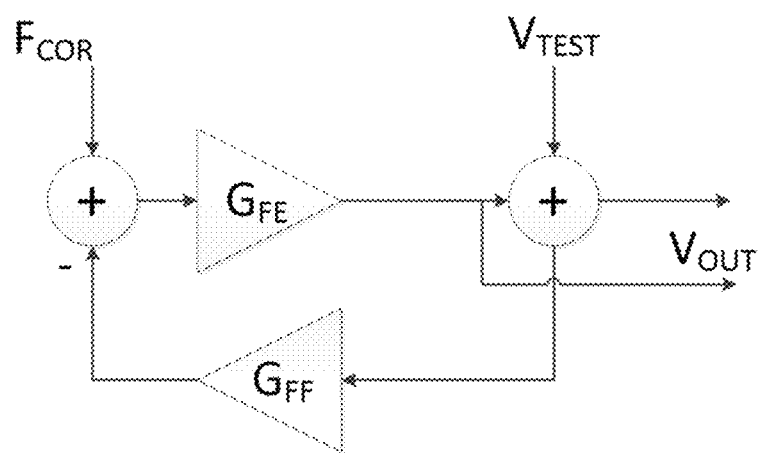
FIG. 2 illustrates a small signal model of a closed-loop gyroscope.

The FIG. 2 shows a simplified small signal model of a closed-loop gyroscope, also known as a servo gyroscope.

A front-end small signal gain $G_{FE}$ comprises all elements contributing to gain of a detection signal path, also known as a secondary signal path, in other words a signal path that provides an electrical signal obtained from a mechanical detection element. In a capacitive gyroscope that provides an output voltage, these comprise a force-to-capacitance gain and a capacitance-to-voltage gain. A closed-loop gyroscope comprises a feedback signal path. A feedback small signal gain $G_{FF}$ comprises all terms that affect sensitivity from voltage back to force domain. In this exemplary system these comprise the electrostatic force term Fc, or, to be more precise, a linearized version of a transducer gain from AC voltage to electrostatic force Fc. $F_{COR}$ represents a Coriolis force signal, wherein the Coriolis force is due to an external angular rotation rate about a detection axis the gyroscope is subject to, $V_{TEST}$ represents an internal test signal and $V_{OUT}$ represents any output voltage signal received from the sense loop, for example voltage corresponding to detected angular rate, a test signal voltage and/or a quadrature voltage.

Assuming that the linearized total small signal loop gain $G_{FF}*G_{FE} \gg 1$, the small signal closed-loop equation for gain can be written as $$\frac{V_{OUT}}{F_{COR}} \approx \frac{1}{G_{FF}}$$

and as $$\frac{V_{OUT}}{V_{TEST}} \approx 1$$

The above two equations have important implications for understanding operation of the gyroscope. The feedback small signal gain $G_{FF}$ determines small signal gain from the Coriolis force signal $F_{COR}$ to the output voltage signal $V_{OUT}$. Thus, also any imprecisions and/or instability of the feedback small signal gain $G_{FF}$ will be transferred to respective inaccuracy of output voltage signal $V_{OUT}$ and thus to rate sensitivity. The second equation also indicates that because of high total loop gain at the frequency of the internal test signal, $V_{TEST}$ cannot be used to measure the magnitude of the feedback small signal gain $G_{FF}$.

When the linearized total small signal loop gain $G_{FF}*G_{FE} \approx 1$, the approximation becomes more complex and frequency dependency of the gain needs to be taken into account.

Figure 3:
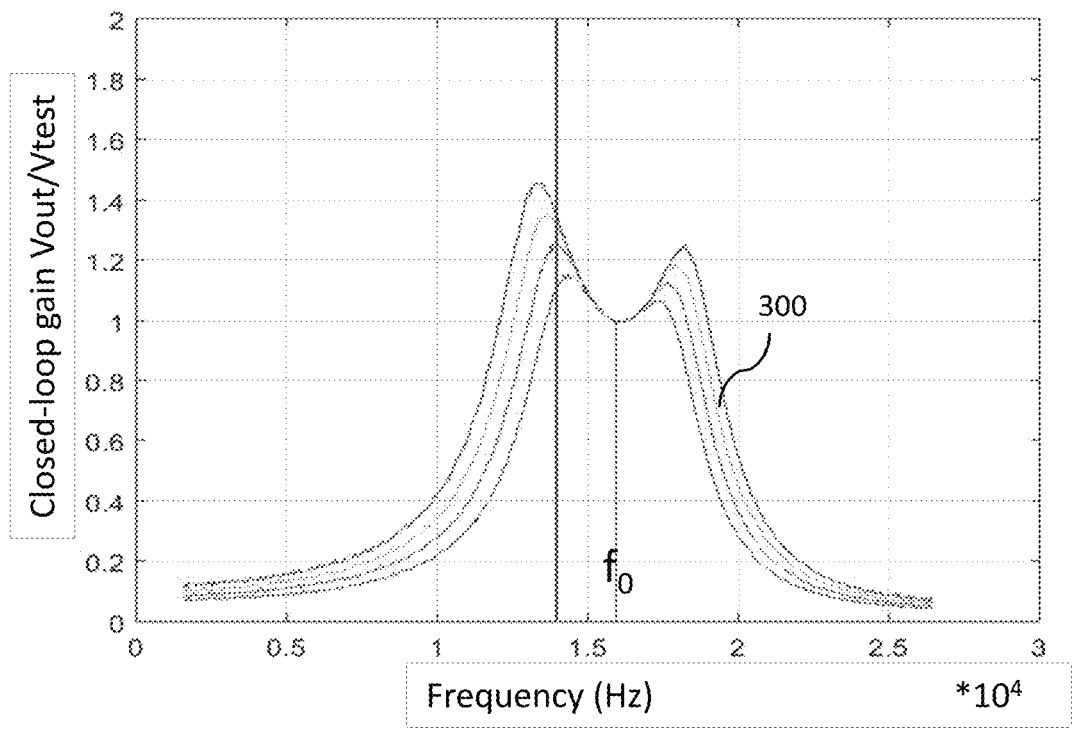
FIG. 3 shows a graph illustrating effect of the front-end small signal gain on an output voltage signal and on sensitivity of an internal test signal.

FIG. 3 shows a graph illustrating effect of the front-end small signal gain $G_{FE}$ on the output voltage signal $V_{OUT}$ and on sensitivity of the internal test signal $V_{TEST}$. On the nominal frequency $f_0$, the linearized total closed-loop gain $$\frac{V_{OUT}}{V_{TEST}} = 1.$$

In this non-limiting example, the nominal frequency $f_0$ is about 16 kHz. For demonstration purposes, front-end small signal gain $G_{FE}$ was deliberately changed to four different values, and the resulting frequency-dependent total closed-loop small signal gain curves (300) were plotted. It becomes clear that there is no change in the unity gain on the nominal frequency $f_0$. However, on both sides of the nominal frequency $f_0$, there are two clear gain peaks in the total closed-loop gain, the gain and position of which are dependent on the frequency and on the front-end small signal gain $G_{FE}$. Thus, a test signal that has a frequency deviating from the nominal frequency $f_0$ will provide information on changes in the loop gain.

When applied on a closed-loop gyroscope, the invention utilizes the frequency dependency of the total closed-loop gain illustrated in the FIG. 3 for enabling compensation of changes in gyroscope sensitivity.

In case of a closed-loop gyroscope, for enabling such compensation, it is important that both the front-end small signal gain $G_{FE}$ and the feedback small signal gain $G_{FF}$ have same dominating sources of gain variation. This requirement is fulfilled automatically for example if similar transducers are used both for force feedback actuation of a sense element and for sense detection, and/or the same biasing is used both for sense detection and for feedback actuation. However, an open-loop gyroscope does not comprise any feedback, but there is similar correlation between the frequency dependency of gain or phase of and angular rate sensitivity.

A single suitably selected test frequency that is off the nominal frequency $f_0$ is sufficient for enabling detecting sensitivity drift, in other words changes in sensitivity that do not vary significantly between consecutive rate signal samples, but rather appear as a gradual change or as a slowly developing trend of change in the sensitivity. One way to utilize the frequency-dependency of the total closed-loop gain is to use at least two different test signals with mutually different frequencies, a single test signal that carries a single test tone, thus two different test frequencies, or a single test signal that carries two different test tones, thus including four different test frequencies. An example of a suitable test signal is disclosed in the Finnish patent application FI20195537, in which the test signal is a test clock signal that carries at least two different test tones with distinctive fundamental frequencies.

Figure 4:
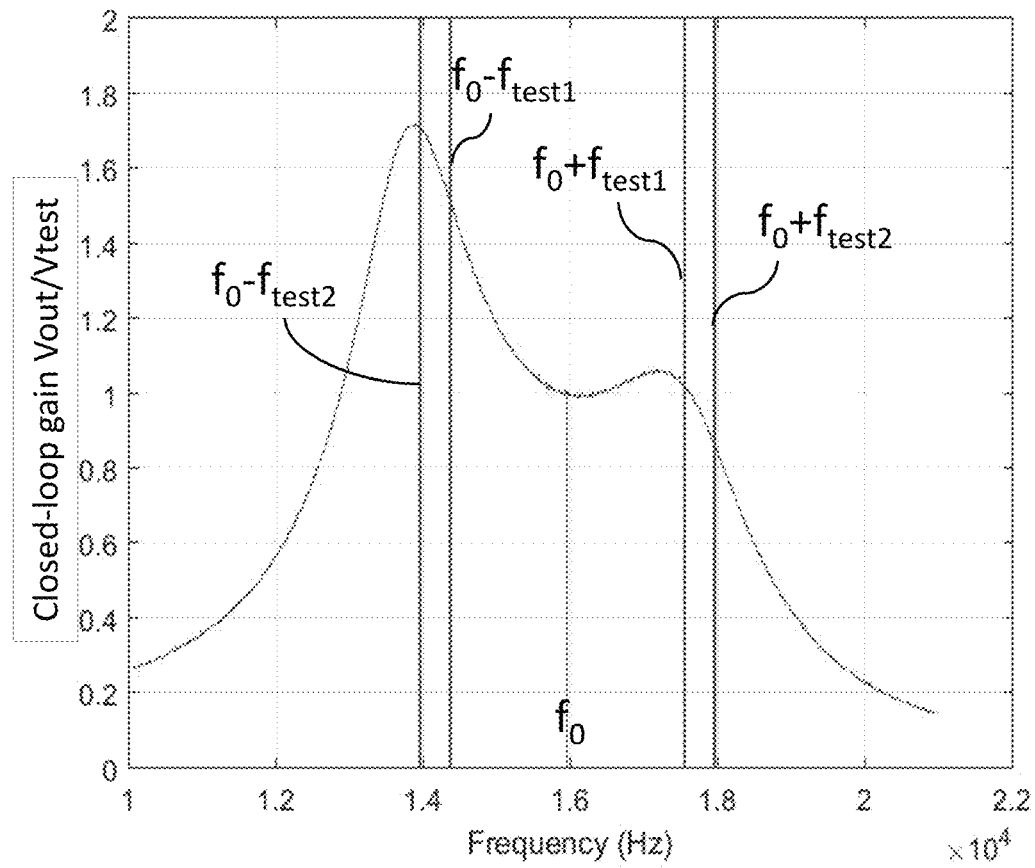
FIG. 4 illustrates an example of placing two different test tones into a test signal for detecting variations in the total closed-loop gain.

FIG. 4 illustrates an example of placing two different test tones into a test signal $V_{TEST}$ for detecting variations in the total closed-loop gain. The test signal $V_{TEST}$ in this example is obtained by multiplying (modulating) a carrier signal with two test tones. If two test tones are used, they are preferably selected so that they have mutually different fundamental frequencies. In this example, the two test tones are $f_{test1}=1.6$ kHz and $f_{test2}=2$ kHz. However, only a single test tone is required for enabling detection of variations in the total closed-loop gain. The test tone(s) should be selected such that they it is/are easy to implement, the test tone(s) should reside within the frequency range of the transfer function of the secondary loop but not at the angular rate signal frequency. Selection of the frequency of the test tone or test tones is not limited to the given examples, but any suitable test tone or tones may be chosen depending on the implementation, in particular on basis of the shape of the total closed-loop gain function over frequency of the specific gyroscope implementation.

When the drive signal $V_{DRIVE}$ with nominal frequency $f_0=16$ kHz is used as a test carrier and modulated with the two test tones, this results to test signals of form $V_{TEST}=V_{MOD}*V_{DRIVE}$, where $V_{DRIVE}$ is a test carrier component and $V_{MOD}$ is the signal carrying the carrier modulating frequency, in other words the test frequency signal also known as the test tone. In the resulting test signal $V_{TEST}$, there are four test frequency components, namely $f_0 \pm f_{test1}$ and $f_0 \pm f_{test2}$, as illustrated in the FIG. 4. The test tone placing shown in the FIG. 4 will be utilized in the following examples. In case only a single test tone, i.e. either of the test frequencies $f_{test2}$ and $f_{test2}$ was used, two frequency components can be detected in the modulated signal, namely $f_0 \pm f_{test1}$ or $f_0 \pm f_{test2}$.

Although specific frequencies are used in the above example, the actual frequencies of both the test carrier and the test tone or test tones used for modulating the test carrier are a matter of design choice, depending on the specific gyroscope device and its characteristics.

Figure 5:
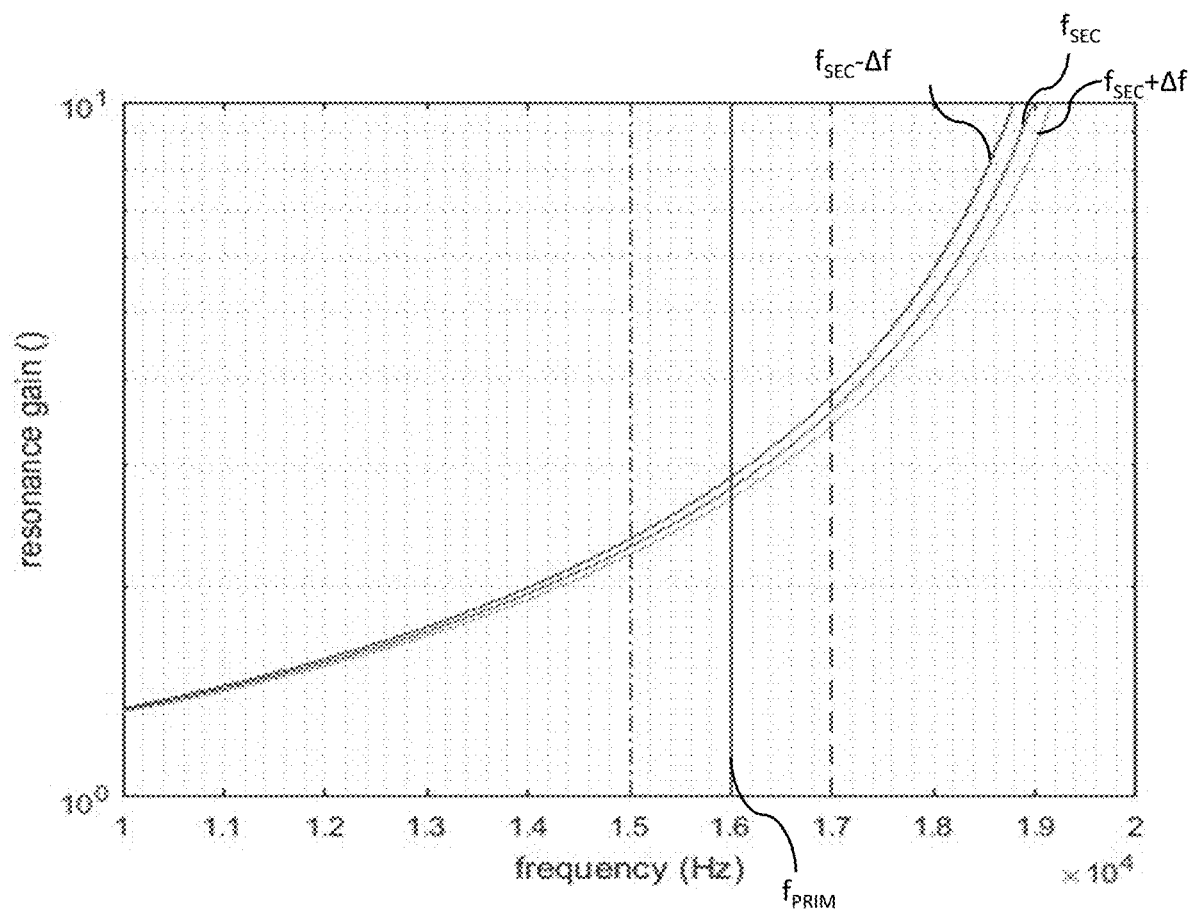
FIG. 5 illustrates effect of slight variations between primary and secondary frequencies of an open-loop low-pass MEMS gyroscope.

FIG. 5 illustrates effect of slight variations of a gap between electrodes of an open-loop low-pass MEMS gyroscope, which inherently causes slight variations between primary and secondary frequencies. Variation of the gap effectively causes change in the electrical spring, which consequently changes the nominal frequency. Primary resonance frequency ($f_{PRIM}$) of the exemplary gyroscope is 16 kHz. In an open loop gyroscope, a clear frequency difference is typically designed between the primary resonance frequency ($f_{PRIM}$) of the primary resonator and the secondary resonance frequency ($f_{SEC}$) of the secondary resonator. In this example, the secondary resonance frequency is 20 kHz. Thus, there is a 4 kHz frequency difference between the primary and secondary resonance frequencies. A variation in frequency difference causes variation of the resonance gain of the open-loop low-pass MEMS gyroscope. Three curves are plotted in the FIG. 5, which represent resonance gain of the open-loop gyroscope on three different secondary resonance frequencies, $f_{SEC}$, $f_{SEC}+\Delta f$ and $f_{SEC}-\Delta f$. In this example, $f_{SEC}=20$ kHz, and $\Delta f=200$ Hz, corresponding to a 1% change in the secondary resonance frequency $f_{SEC}$, that occurs over time for example due to ageing. In this example, a the primary resonance frequency $f_{PRIM}=16$ kHz is used as a test carrier signal $f_{carrier}$, modulated with a single 1 kHz test tone $f_{test}$, which results in two test frequencies appearing in the test signal, namely $f_{carrier}-f_{test}=15$ kHz and $f_{carrier}+f_{test}=17$ kHz. Both or just one of these test frequencies may be used for detecting changes in the resonance gain. In an alternative embodiment, a single test frequency may be used as the test signal, without modulating the test carrier signal with a test tone. For example, a sine wave test signal with a frequency of 17 kHz could be used.

Figure 6:
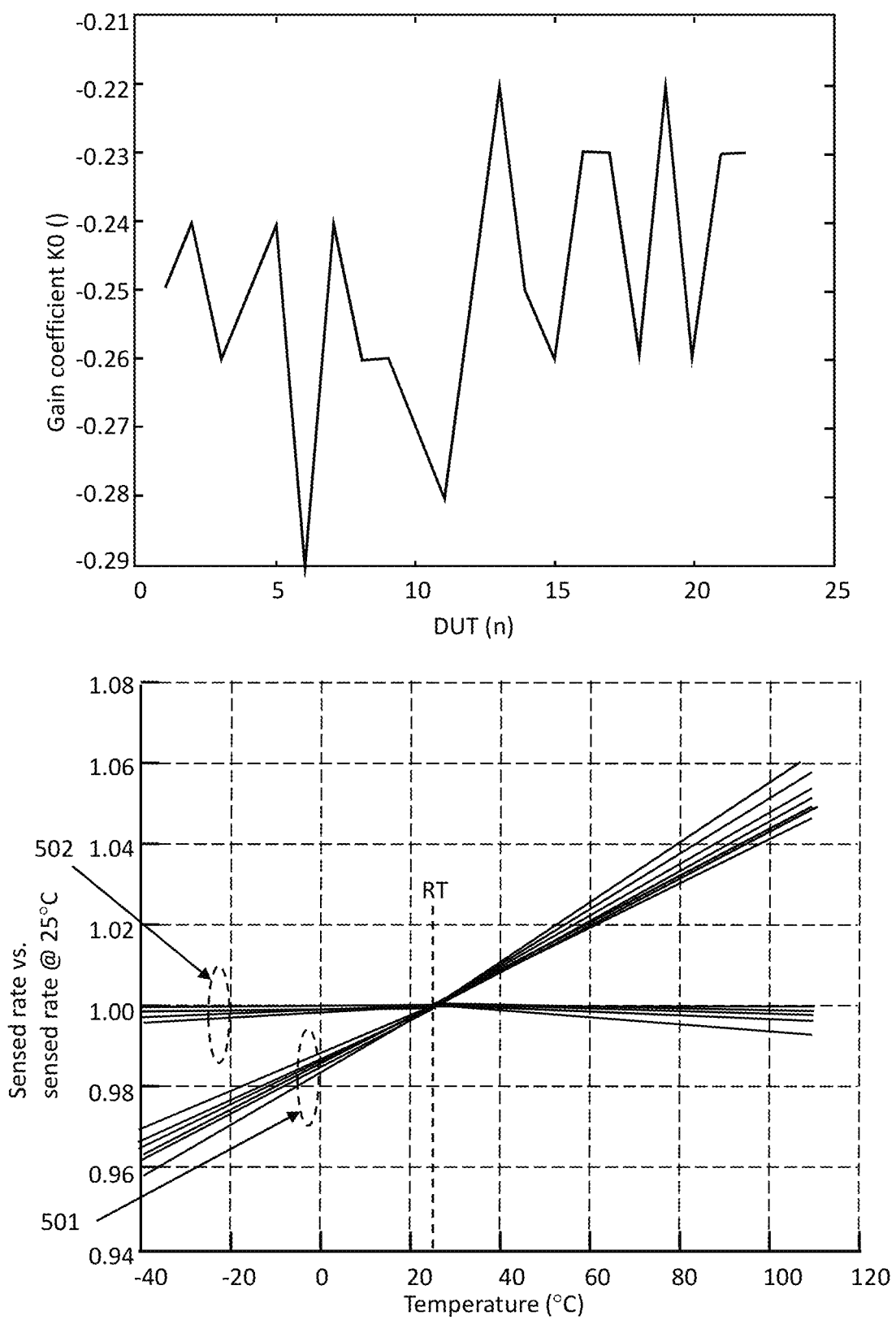
FIG. 6 illustrates an example of compensating effects of temperature changes in total closed-loop gain on basis of a test signal.

FIG. 6 illustrates an example of compensating effects of temperature changes in total closed-loop gain on basis of a test signal. The test signal used in the illustrated example is based on modulation of the carrier with a first test tone $f_{test1}$. Corresponding graphs may be generated for the second test tone $f_{test2}$ but omitted to maintain the description short.

For visualization purposes, results are normalized to a selected point. In this example, the test signal $V_{TEST}(RT)$ is normalized with respect to its value at room temperature RT. The normalized test signal $V_{TEST\_SHIFT}$ may be expressed with the function:

$$V_{TEST\_SHIFT}=V_{TEST}(i)/V_{TEST}(RT) \quad (1),$$

where $V_{TEST}(RT)$ is the reference value (normalization value) and $V_{TEST}(i)$ represents received measurement signal. Further, a compensated angular rate signal is calculated by finding a gain coefficient K0, so that the root mean square error over temperature of the compensated angular rate value $SENS_{COMP}$ is minimized. The resulting angular rate compensation function is:

$$SENS_{COMP} = \frac{SENS_{RAW}}{1-(1-V_{TEST\_SHIFT})*K0} \quad (2)$$

This may also be expressed as:

$$SENS_{COMP} = \frac{SENS_{RAW}}{1-(V_{TEST}(RT)-V_{TEST}(i))/V_{TEST}(RT))*K0} \quad (3)$$

The graphs shown in the FIG. 6 illustrate a test performed for twenty different units of the same gyroscope product, in which each of the devices was subjected to change of temperature into selected test temperatures within a range from −40° C. to +110° C., at points −40° C., +25° C. and +110° C. The upper graph shows the values of the gain coefficient K0 calculated for each individual device. It can be noticed that calculation of the gain coefficient K0 is moderately repeatable, since all gain coefficients K0 of the plurality of individual devices fit within about 30% variation window, although K0 fitting was done only once in the beginning of the process, and the stress test was repeated for each device.

The lower graph shows the resulting angular rate detection results normalized with respect to the value at room temperature RT=25° C., while the actual angular rate was held constant. A first cluster of normalized measurement results (501) represents detected angular rates indicated in the output of the gyroscope without gain compensation, which shows a clear temperature dependency of the obtained angular rate reading. A second cluster of normalized measurement results (502) represents detected rates with gain compensation using the angular rate compensation function (1) or (2) with the calculated gain coefficient K0. Temperature dependence of the detected angular rate reading is clearly reduced, and thus accuracy of the angular rate detection is improved by the compensation. Instead of room temperature RT, any reference temperature T0 may be selected as the reference condition.

Figure 7:
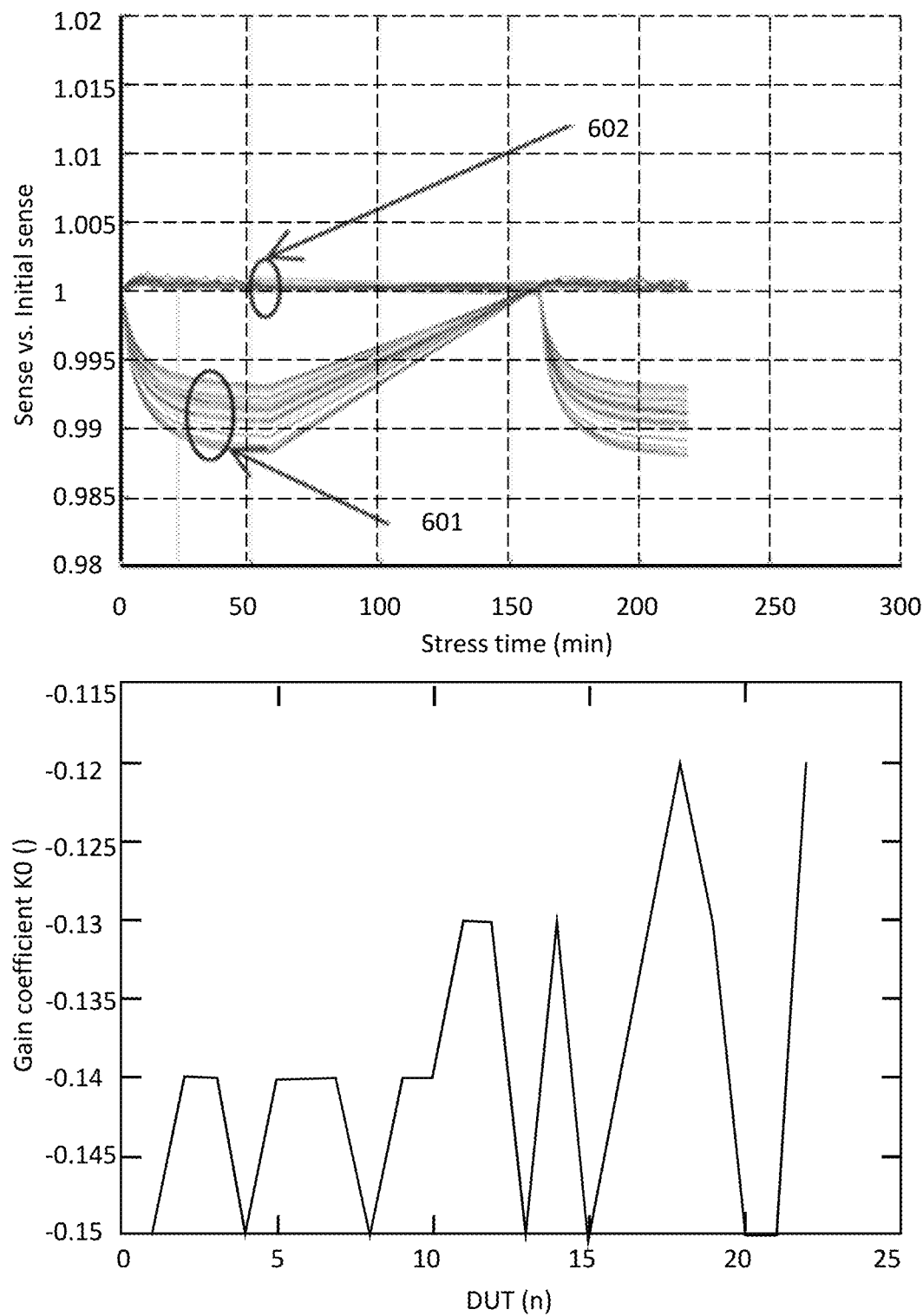
FIG. 7 illustrates an example of compensating effects of an unstable biasing environment of the MEMS element.

FIG. 7 illustrates an example of compensating effects of an unstable biasing environment of the MEMS element. Biasing affects the gyroscope via a capacitance-to-current transducer gain when DC detection is utilized. Biasing also affects the feedback transducer when electrostatic force is used for feedback. In such case, bias voltage across feedback capacitor gap comprises DC bias $V_{DC}$ and AC feedback signal $V_{AC}$. Additionally, biasing may affect resonance gain, in other words total closed-loop gain at the resonance frequency through electrical spring effect. Each tested gyroscope device was subjected to the same sensitivity measurement sequence over a 220 min stress test period and a pre-planned variation pattern in bias voltage and temperature, while the same angular rate was used for testing each device.

The lower graph of the FIG. 7 shows the values of the gain coefficient K0 calculated for each unit among the twenty tested units. In this example, maximum variation of the gain coefficient K0 is in level of 20% among all tested units, which again indicates that a fitting process using the gain coefficient K0 is well repeatable.

In the upper graph of the FIG. 7, the temperature normalization term $V_{TEST}(RT)$ is replaced by a normalization term representing an initial measurement result $V_{TEST}(0$ min), in other words the measurement result received at time 0 min. The upper graph thus shows angular rate detection results normalized with respect to the initially measured value, while subjecting each gyroscope unit with the same pre-programmed variation pattern of changes in the DC bias voltage $V_{DC}$. The upper graph of the FIG. 6 shows again two clearly distinctive clusters of normalized angular rate measurement results. The broader cluster (601) represents normalized angular rate measurement results with twenty different units with no sensitivity compensation. The more compact cluster (602) represents normalized angular rate measurement results using sensitivity compensation using the respective calculated gain coefficients K0 with the A clear improvement in bias independence of the angular rate measurement results, by a factor of >10 is achieved.

Further, a compensated angular rate signal is calculated by finding a gain coefficient K0, so that the root mean square error over test time period of the compensated angular rate value $SENS_{COMP}$ is minimized. In this example, the resulting angular rate compensation function is:

$$SENS_{COMP} = \frac{SENS_{RAW}}{1-(1-V_{TEST\_SHIFT})*K0} \quad (5)$$

or its equivalent:

$$SENS_{COMP} = \frac{SENS_{RAW}}{1-(V_{TEST}(0\text{min})-V_{TEST}(i))/V_{TEST}(0\text{min}))*K0} \quad (6)$$

The above described finding of significant correlation between sensitivity drift and test signal drift is advantageously utilized in embodiments according to the invention in a system, which already applies at least one test tone, or at least two test tones with distinctive fundamental frequencies for continuous self-testing. Finding a gain coefficient K0 is needed, and it is fairly straightforward to implement, when suitable test tone(s) for other self-testing purposes is/are already available in the system; no new test signals are required. It is also straightforward to generate a single test tone with wanted frequency.

When temperature compensation is built into the system, also the test signal is preferably temperature compensated. There is no absolute need to compensate for repeatable temperature effects, while it may be done for simplifying the overall compensation scheme. More important is to compensate for effects that are not present during trimming of the MEMS gyroscope. With trimming we refer to steps taken after manufacturing the gyroscope device units, which are often necessary to calibrate the gyroscope device units after manufacturing. Need for trimming rises from the fact that manufacturing process of miniature MEMS devices in general includes several sources of inaccuracy, which affect physical characteristics of the devices.

Effects that rise need for compensation of sensitivity drift include for example assembly related stress changes and other life-time performance drift sources, such as humidity effects, leakage effects due to moisture or impurities, material aging, soldering, storage effects, bias dependency and/or ion transfers. As the gain coefficient K0 is not heavily temperature dependent, it may be sufficient to use a single gain coefficient K0 value, for example a temperature-independent one. Tests have indicated that with an exemplary temperature shift from 85° C. to 75° C., shift of the gain coefficient K0 is only about 2%.

In practice, preferable steps for processing of the test signal comprise: 1. zeroing any offset in the test signal values relative to a predefined reference value, potentially over a temperature range, and 2. compensating sensitivity drift using a weighted gain coefficient K0 as pointed in the first equation. If there is heavy temperature dependency in test signal raw offset, it may be feasible to include over-temperature compensation and normalization in the coefficient K0.

We first introduce parts of a MEMS gyroscope that are merely illustrated for providing a full picture of the basic functionalities of the exemplary device used for explaining the embodiments. These parts are all common for the later disclosed embodiments shown in the FIGS. 7, 9 and 10.

A MEMS gyroscope sensor element (700) comprises drive part (701) and a sense part (711). The drive part (701) comprises at least one primary oscillation element that is driven to primary motion by at least one electrically controlled drive transducer, which cause a force on the at least one primary element that drives it into the oscillating primary motion. Front-end circuitry comprised in the drive part (701) comprise a transducer element that converts the primary motion of the at least one primary oscillation element into an electrical signal, referred to as a drive detection signal (71) or as a primary detection signal (71), provided as input to a drive loop circuitry (702). In this example, amplitude and/or frequency of the primary motion are controlled by a feedback loop comprising the drive loop circuitry (702). The feedback loop controls the drive motion with a feedback signal (73) that is provided towards the drive part (701) with a back-end circuitry comprised in the drive part (701), the back-end circuitry comprising the drive transducers. The closed loop comprising the drive part (701), the drive loop circuitry (702) and interconnections thereof may be referred to as a drive loop. The drive loop circuitry (702) is configured to provide a test signal (75). Preferably, in the case of single test frequency the test signal phase and frequency are selected so that angular rate signal (76) does not change demodulated DC value of the test signal component. When the test signal (75) is itself a multiplied, AM modulated signal $V_{TEST}=V_{PRIMARY}*V_{TONE}$, comprising a test carrier portion $V_{PRIMARY}$ on the primary frequency multiplied with one or more fundamental frequency test tones $V_{TONE}$, the carrier portion is phase and frequency synchronous with the drive motion. Phase of the test carrier portion may be synchronized with either the position or the speed of the primary motion of the primary oscillation element. If the carrier signal is selected to be in phase with the position of the primary motion, and the secondary loop generates only a small phase change, the test signal remains essentially in quadrature phase relative to the angular rate signal, and is thus less likely to be subject to any external noise even if no additional phase trimming is provided for the quadrature demodulation signal (90Q).

The MEMS gyroscope sensor element (700) further comprises a sense part (711) that comprises at least one mechanical element referred to as a sense element, also known as a detection element or a secondary element. The sense element is configured to be coupled into the secondary oscillation motion by Coriolis force when the MEMS gyroscope is subject to angular velocity. Front-end circuitry of the sense part (711) comprises at least a transducer element that converts the secondary oscillation motion of the at least one sense element into an electrical signal, referred to as a sense detection signal (72) or a secondary detection signal (72), provided as input to a sense loop circuitry (712). The sense part (711), the sense loop circuitry (712), possible further circuitry, for example amplifiers and/or attenuators (720, 730) form together a closed loop referred to as a sense loop, also known as a secondary loop.

A summing element (740) of the sense loop may be configured to sum an amplified rate detection signal with the test signal (75) for producing a force feedback signal (74), that is provided towards the sense part (711) with a back-end circuitry comprised in the sense part (711). The back-end circuitry comprises a feedback transducer that converts the force feedback signal (74) into a force that is used to adjust oscillation of the sense element. The sense loop provides an angular rate signal (76) that represents the detected angular rate. The angular rate signal (76) is then demodulated by a rate demodulator (750) using an in-phase carrier signal, in other words a carrier signal that is in phase with the drive motion. This demodulation produces a raw rate signal (78), which is an uncompensated version of angular rate detection result.

The test signal (75) is fed into the sense part summed in the force feedback signal (74). In other words, the test signal (75) is a component signal in the force feedback signal (74), and the angular rate signal (76) includes information on both the angular rate and on the effects of the sense loop (711, 712, 720) on the test signal (75). The angular rate signal (76) also includes information on the parts of the drive loop circuitry (702) which are responsible for generating the test signal (75).

Figure 8:
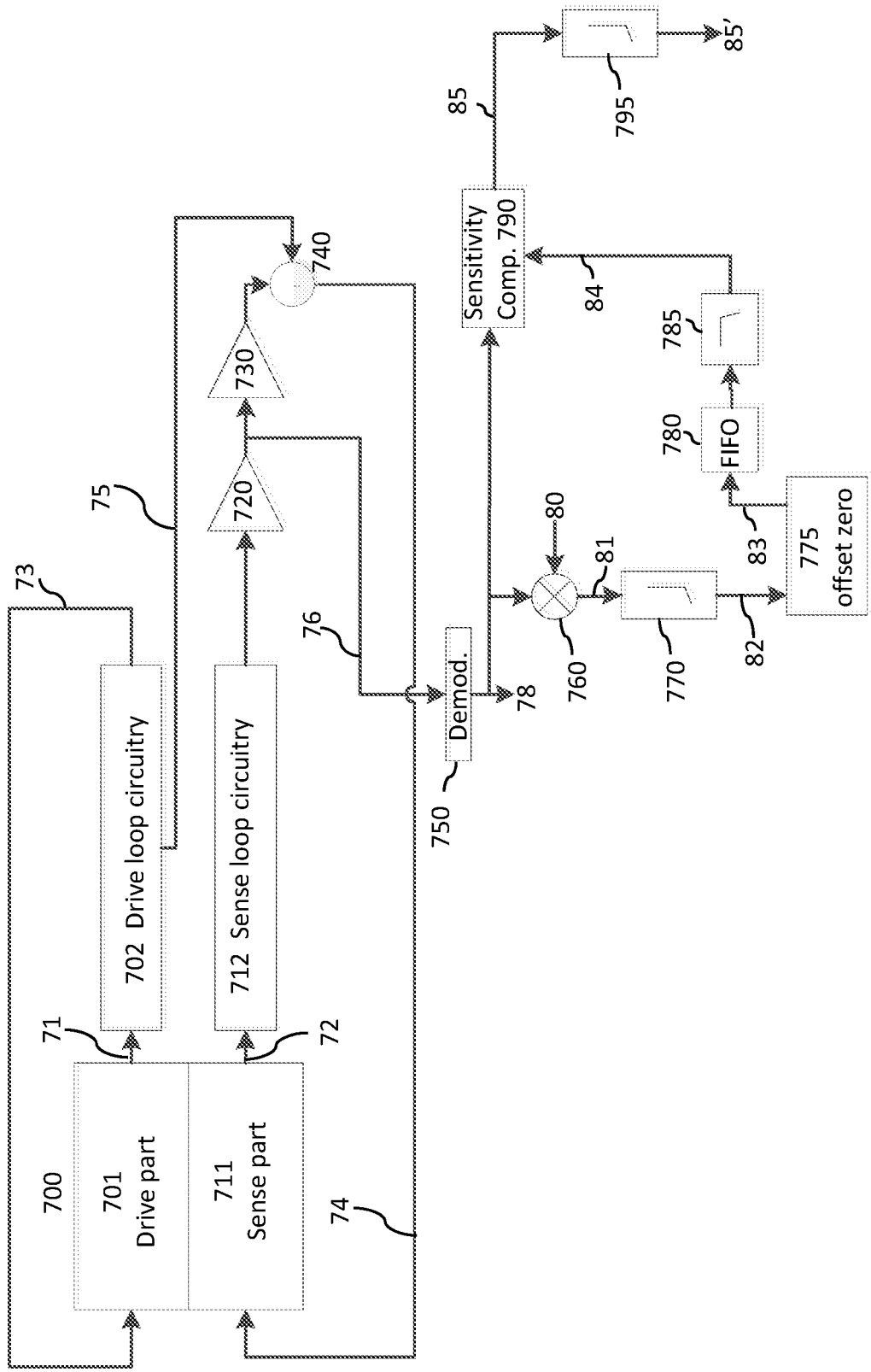
FIG. 8 illustrates a circuitry according to a first embodiment of the invention.

The FIG. 8 illustrates a first embodiment of the invention.

For test signal analysis purposes, the raw rate signal (78) is multiplied with a test carrier signal (80) by a multiplier (760) to produce a DC test signal (81). The test carrier signal (80) corresponds to the frequency of the test tone itself, or the test frequency if a single test frequency is used as test signal. Preferably, the phase of the test carrier signal (80) is selected in such a way that the magnitude of the DC test signal is maximized. The name DC test signal (81) thus refers to a fully demodulated test signal received from the secondary loop, but it should not be understood as a DC voltage. Rather, the DC test signal (81) can be characterized as a fundamental term of the multiplication operation. If there is no deviation of the loop gain and/or phase at the secondary loop from the original, calibrated values, the DC test signal (81) is a DC voltage. If there is any sensitivity and/or phase drift, the DC test signal (81) magnitude will change, the rate of change being equivalent to that of occurring sensitivity and/or phase drift. A first low pass filter (770) limits signal band of the DC test signal (81) to e.g. 50 Hz to remove spurious signal components with higher frequencies. This first low pass filtering removes any harmonic components of test tone(s) in the test signal, and a raw test signal $V_{TEST}(\text{all})$ (82) remains, that includes all samples of test signal data.

Any offset of the raw test signal (82) signal is zeroed by a test signal offset zeroing circuitry (775) using a reference value obtained at known condition to obtain an offset zeroed test signal (83). The reference value may be obtained for a MEMS gyroscope element during calibration of the MEMS gyroscope element, for a MEMS module after packaging the MEMS gyroscope element into the MEMS module, for a MEMS module after installing it on a printed circuit board (PCB), or even for a MEMS device installed in the final application. In all above situations, the reference value may be obtained in a set temperature, for example room temperature (RT), or over a temperature range.

Thus, the operation of the test signal offset zeroing circuitry (775) substantially corresponds to the term within brackets in either of following equations:

$$SENS_{COMP} = \frac{SENS_{RAW}}{1 - [(V_{TEST\_COMP} - V_{TEST}(i))/V_{TEST\_COMP}] * K0} = \frac{SENS_{RAW}}{1 + [(V_{TEST}(i) - V_{TEST\_COMP})/V_{TEST\_COMP}] * K0} \quad (7)$$

In other words, the test signal offset zeroing circuitry (775) calculates a deviation of the test signal sample from the test signal normalization value ($V_{TEST\_COMP}$). Thus, the test signal normalization value ($V_{TEST\_COMP}$) is also used as the offset zeroing DC value for test signal offset zeroing. The gain coefficient K0 can be also designed to include the normalization, i.e. dividing the original gain coefficient K0 by the test signal normalization value ($V_{TEST\_COMP}$), in which case the zeroing operation does not need to be normalized. In this case, the zeroing operation of the test signal offset zeroing circuitry (755) be expressed simply as [$V_{TEST\_COMP} - V_{TEST}(i)$], such that the sensitivity compensation equation may be expressed as:

$$SENS_{COMP} = \frac{SENS_{RAW}}{1 - [V_{TEST\_COMP} - V_{TEST}(i)] * K0/V_{TEST\_COMP}}$$

Further, instead of division the operation may be approximated for example by Taylor series, when this allows more hardware optimal implementation of the sensitivity compensation circuitry (790). This is especially feasible when the test signal normalization value $V_{TEST\_COMP}$ is a constant value.

Known condition may refer for example to room temperature, or to a temperature range. The zeroing operation [($V_{TEST\_COMP} - V_{TEST}(i))/V_{TEST\_COMP}$] or $V_{TEST\_COMP} - V_{TEST}(i)$ thus corresponds to calculating a deviation of the current test signal sample $V_{TEST}(i)$ from the test signal normalization value ($V_{TEST\_COMP}$), wherein the former is readily normalized to the reference value, and the latter is normalized at a later stage.

The test signal normalization value ($V_{TEST\_COMP}$) may be an average $V_{TEST}$ value measured when also the gyroscope sensitivity can be measured and compensated and thus allows identifying a change in the test signal magnitude and further in gyro sensitivity. The test signal normalization value ($V_{TEST\_COMP}$) may be for example one of the two possible examples given above, namely a reference value in any preset temperature $V_{TEST}(T0)$ and/or obtained at a selected point of time $V_{TEST}(0 \text{ sec})$ and/or obtained with a predefined bias voltage. The offset zeroed test signal (83) is used further in the signal chain.

If a modulated test signal (75) is used, the same test signal (75) may be used both for continuous self-testing (not shown) and for sensitivity compensation. For the latter purpose, illustrated in the FIG. 8, the offset zeroed test signal (83) may further be fed to an "IF and First-In-First-Out" (IF & FIFO) circuitry (780), which prevents offset zeroed test signal samples that significantly deviate from majority of offset zeroed test signal samples from entering the sensitivity compensation. Since it is known that sensitivity drift is caused by gradual change, any significantly deviating samples may safely be disposed as reflecting other error sources than sensitivity drift.

The IF & FIFO circuitry (780) allows only the samples which are sufficiently close to zero to enter the sample queue. A practical reason that may rise a need for the IF & FIFO circuitry (780) functionality is that there may be an external rate signal close to at least one of the test signal frequencies, which would erroneously cause DC level of the test signal and thus also the offset zeroed test signal (83) to be deflected from the intended target level. After the IF & FIFO circuitry (780), accepted test signal samples may further be low-pass filtered by a second low-pass filter (785) to a final bandwidth, which is in the order of few Hz or below. Depending on the implementation, the offset zeroed test signal (83, 84) may be used either as received from the test signal offset zeroing circuitry (775) or after further low-pass filtering (785) for sensitivity compensating the raw rate signal (78) by a sensitivity compensation circuitry (790) using a gain coefficient K0 to cancel effects of the sensitivity drift sources from the raw rate signal (78). The sensitivity compensated rate signal (85) may further be low-pass filtered with a post-processing low-pass filter (795). The post-processing low-pass filter (795) may be needed, if data rate of the unfiltered offset zeroed test signal (83) or the filtered offset zeroed test signal (84) fed into the sensitivity compensation circuitry (790) is not clearly greater than that of the raw rate signal (78), for ensuring that the resulting sensitivity compensated rate signal (85') is a continuous signal. Further, post-processing low-pass filter (795) may be utilized for determining noise bandwidth of the sensitivity compensated rate signal (85).

Functionality of the sensitivity compensation circuitry (790) may be characterized as comprising defining a sensitivity compensation multiplier and multiplying the raw rate signal (78) with the sensitivity compensation multiplier.

The sensitivity compensation multiplier may be defined as corresponding to equation $$\frac{1}{1 - ((V_{TEST\_COMP} - V_{TEST}(i))/V_{TEST\_COMP}) * K0}$$

where $V_{TEST\_COMP}$ is the defined reference value for the specific MEMS device, and $V_{TEST}(i)$ represents received measurement signal, and K0 is the gain coefficient. In the alternative implementation, the sensitivity compensation multiplier may be defined as corresponding to an alternative form of the same equation $$\frac{1}{1 - ((V_{TEST_{COMP}}) - V_{TEST}(i)) * K0/V_{TEST\_COMP}}$$

where the term $K0/V_{TEST\_COMP}$ may be calculated by the sensitivity compensation circuitry (790). This is particularly useful if any part of the term $K0/V_{TEST\_COMP}$ is dependent on a variable, for example on temperature or bias voltage. The term $K0/V_{TEST\_COMP}$ may also be stored in memory and used in calculation of the sensitivity compensation multiplier as a single value dedicated for the specific MEMS device in case there is only one $V_{TEST\_COMP}$, i.e. it is a value that is not dependent on any variable.

Figure 9:
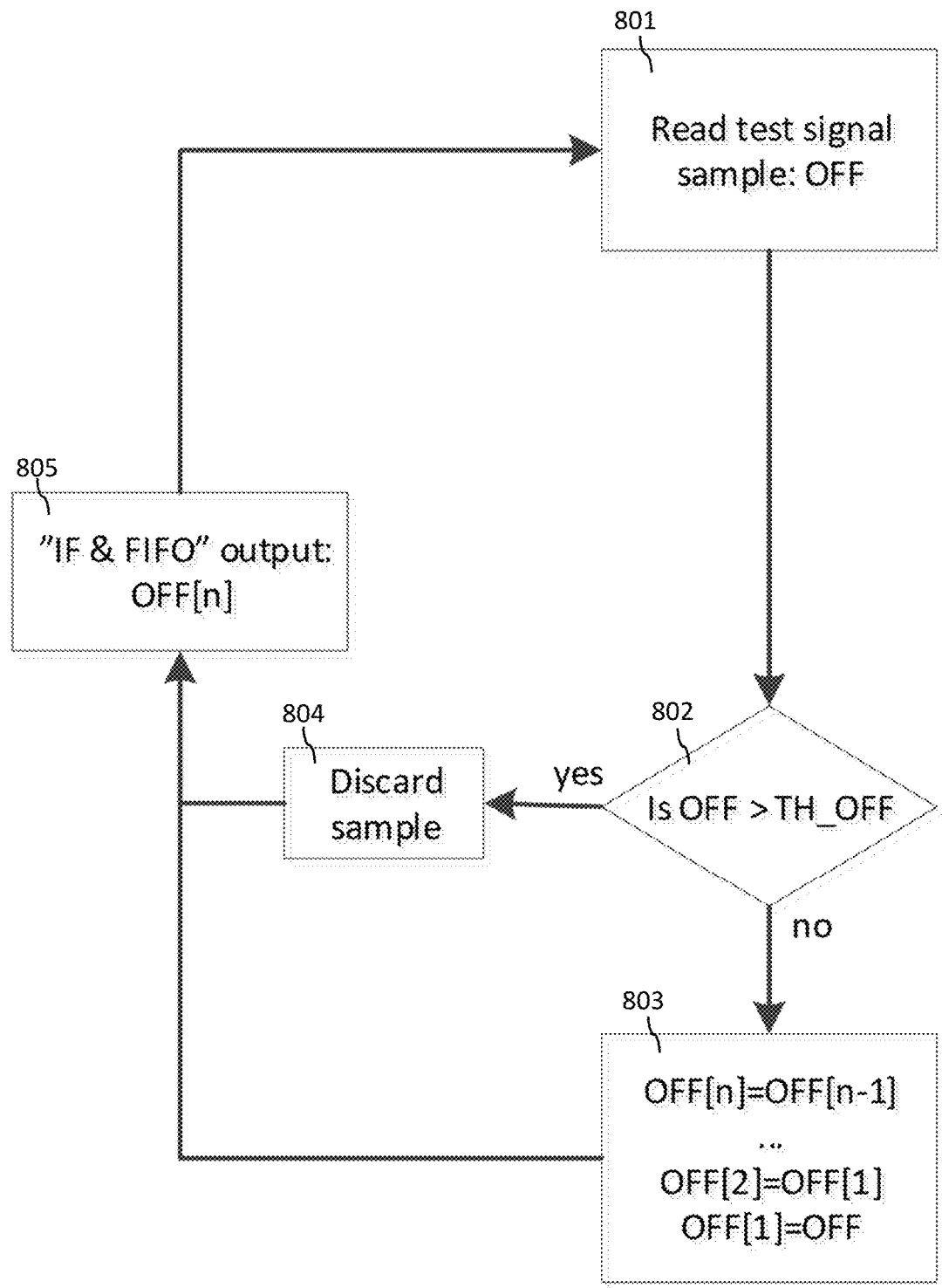
FIG. 9 shows a flow chart explaining operation of an IF & FIFO circuitry.

FIG. 9 illustrates functionality of the IF & FIFO circuitry (780) that forms a loop that handles each arriving test signal sample at a time. In the step 801, a test signal sample "OFF" is read, the test signal sample representing offset of the test signal sample from zero. In the step 802, the offset value "OFF" of the test signal sample from zero is compared to an offset threshold value "TH_OFF". If the offset "OFF" is greater than or equal to the offset threshold value "TH_OFF", this sample is discarded in step 804. If the offset value "OFF" does not exceed the offset threshold value "TH_OFF", the sample is added in the output queue in the step 803. Step 805 illustrates outputting always the currently first sample in the queue, using first-in first-out principle.

Figure 10:
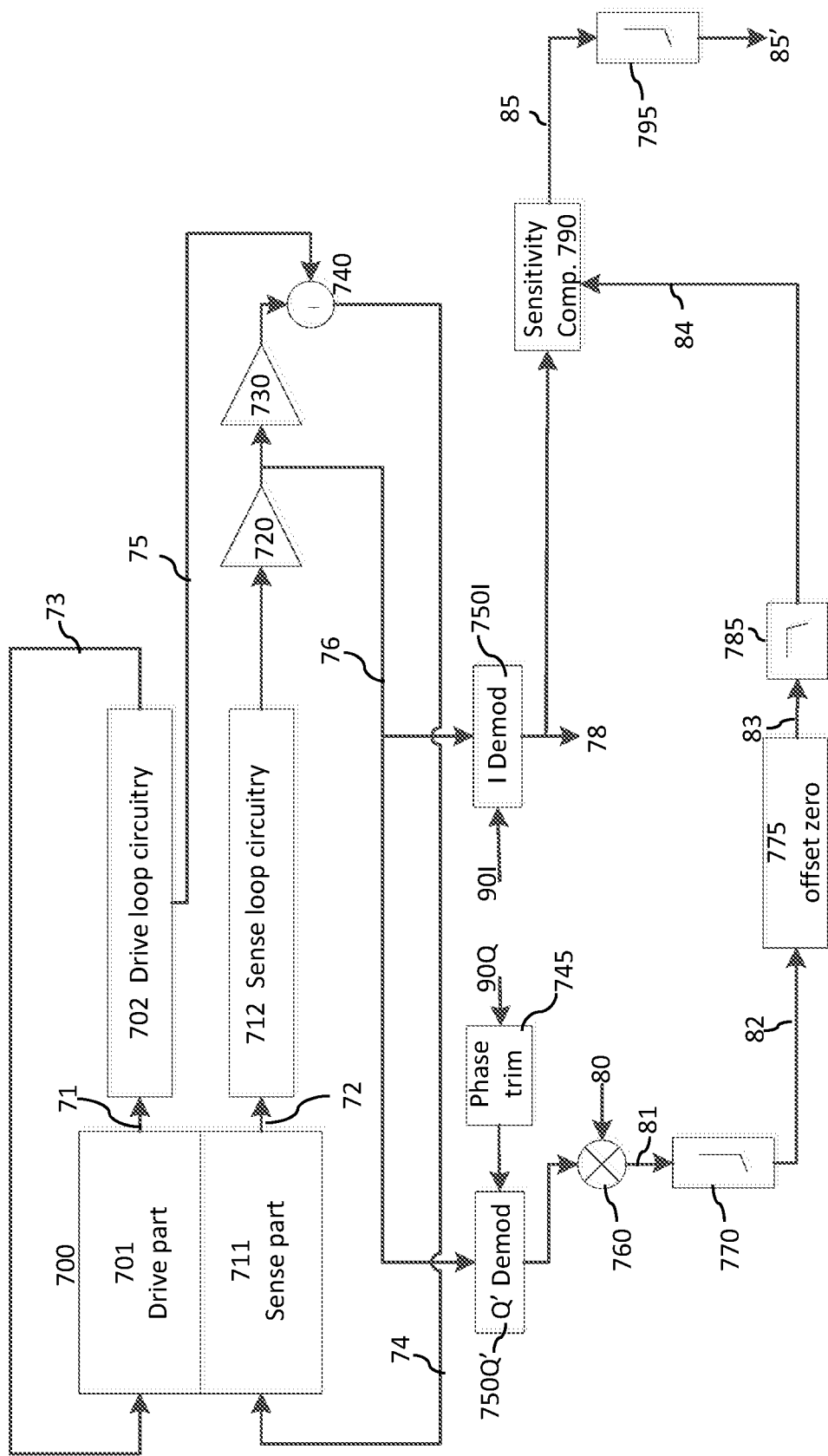
FIG. 10 illustrates a circuitry according to a second embodiment of the invention.

The FIG. 10 illustrates a second embodiment of the invention. It uses the same principle method for sensitivity compensation, but a different carrier signal is used for modulating the test signal (75) and for demodulating the rate signal (76) for obtaining raw test signal (82) than that used for demodulating the rate signal for obtaining raw angular rate signal (78) and, consequently, angular rate information.

In comparison to the first embodiment, the second embodiment that uses different carrier signals for the angular rate signal and for the test signal provides intrinsic isolation of the test signal from the rate signal and from any external rate signal that is close to the test signal. Thus, risk of hampering the compensation by an external rate signal is reduced and need for an IF & FIFO circuitry is avoided.

In the given example, the test signal (75) may be generated using a quadrature-phase carrier signal. This way, the carrier phase for the test signal is different from the carrier phase of the angular rate signal (76). The angular rate signal (76) is demodulated by an in-phase demodulator (750I) using an in-phase carrier signal (90I) for obtaining raw angular rate signal (78), and the angular rate signal (76) is demodulated by a quadrature-phase test signal demodulator (750Q') on basis of a quadrature-phase carrier signal (90Q) for obtaining the raw test signal (82). In other words, the quadrature-phase test signal demodulator (750Q') demodulates the test signal component of the angular rate signal (76). This way, intrinsic isolation is achieved between angular rate signal and the test signal.

When the test signal (75) has a frequency that deviates from the nominal frequency $f_0$, it is likely, that phase of the test signal changes in the sense loop optimized for the nominal frequency. This is because not only small signal gain but also the small signal phase response of the closed-loop gyroscope varies as function of frequency. Therefore, for obtaining an ideal quadrature-phase demodulation signal (90Q), i.e. a quadrature-phase demodulation signal (90Q) that is exactly in quadrature phase in comparison to the in-phase carrier signal (90I), phase of the quadrature-phase demodulation signal may need to be trimmed by a phase-trimming circuitry (745). The phase separation between the angular rate and test signals makes the optional IF & FIFO circuitry (780) of the first embodiment superfluous in this embodiment. However, as in the first embodiment, the offset zeroed test signal (83) may further be low-pass filtered by a second low-pass filter (785) to a final bandwidth, which is in the order of one Hz, before it is fed into the sensitivity compensation circuitry (790).

In an alternative embodiment, the test signal (75) is just a single test frequency that is not multiplied with a specific test carrier signal. In such case, there is no need for using the quadrature-phase test signal demodulator (750Q') for DC:ing the demodulated raw rate signal for obtaining the DC test signal (81), but the raw test signal (82) can be extracted by multiplying the angular rate signal (76) by the multiplier (760) and filtering the multiplied DC test signal (81) with the first low pass filter (770) for removing any harmonic frequencies remaining in the DC test signal (81). Using a single test frequency rather than a test carrier modulated with a test tone or test tones avoids generation of a possible problem caused by the rather likely circumstances that the transfer function of the secondary loop is somewhat different on the two different modulated test frequencies. When two test frequencies are used, the phase trimming circuitry (745) cannot, in practice, find a perfect quadrature phase for demodulating the angular rate signal, because both test frequencies are in practice never exactly in quadrature phase.

In a further alternative, the IF & FIFO circuitry (780) may be placed between the (775) and the second low-pass filter (785) as in the first embodiment. Although use of quadrature-phase test carrier signal makes the system more robust, the IF & FIFO circuitry (780) may further improve robustness of the circuitry. For example, if the angular rate signal path saturates due to an over-range angular rate situation, sensitivity compensation may experience a significant error situation, which is averaged in the filters of the sensitivity compensation circuitry and recovers slowly. In such case, an IF & FIFO circuitry (780) filters out erroneous samples in the raw test signal from being taken into account in sensitivity compensation.

Figure 11:
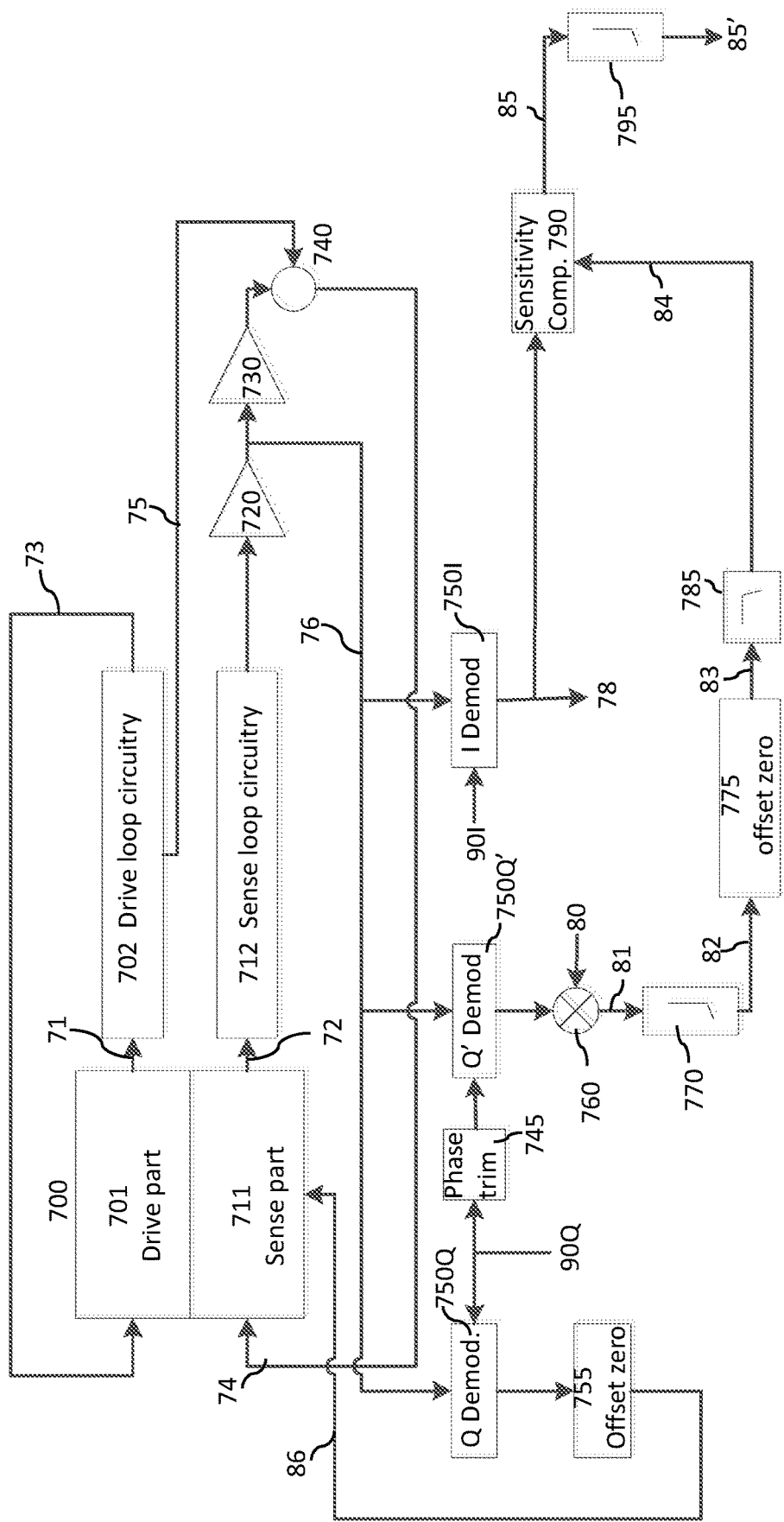
FIG. 11 illustrates a circuitry according to a third embodiment of the invention.

FIG. 11 illustrates a third embodiment of the invention.

In the second embodiment, as described above, there may be some phase error at test frequency, and the quadrature-phase demodulation signal (90Q) used for demodulating the angular rate signal (76) for obtaining test information is no longer exactly in quadrature phase after phase trimming with the phase-trimming circuitry (745).

The third embodiment addresses this inaccuracy by assigning a third demodulation for the angular rate signal (76) that is used for quadrature control. A quadrature control feedback path comprising a quadrature-phase demodulator (750Q) and a quadrature control circuitry (755) provides a quadrature control signal (86), which is fed back to the sense part (711) for compensating mechanical unbalance. This way it can be ensured that a rate signal path comprising the in-phase demodulator (750I) and a quadrature control path comprising the quadrature-phase demodulator (750Q) have exactly orthogonal demodulation carrier signals (90I, 90Q), while carrier phase for the test signal (75) may be selected more freely, and adjusted for demodulation with the phase-trimming circuitry (745). In the exemplary implementation, a test signal demodulation signal for demodulating the angular rate signal (76) in the test signal modulator (750Q') is generated on basis of the quadrature-phase carrier signal (90Q). The phase of the test signal demodulation signal is adjusted with a phase-trimming circuitry (745) for obtaining the test signal demodulation signal that is in phase with the respective carrier signal used for the test signal (75) and that maximally demodulates the test signal component of the angular rate signal (76).

Like the second embodiment, and for the same reasons, an alternative implementation according to the third embodiment uses a test signal that comprises a single test frequency rather than a test signal with a test carrier signal modulated with one or more test tones. In such case, no separate quadrature-phase test signal demodulator (750Q') is needed for demodulating the angular rate signal (76), but the test frequency can be extracted by multiplying the angular rate signal (76) by the multiplier (760) and filtering the multiplied DC test signal (81) with the first low pass filter (770) for removing any harmonic frequencies remaining in the DC test signal (81). Since the test carrier signal (80) is always in phase with the single test frequency, no separate trimming of phase of the test carrier signal (80) is needed.

In a further alternative, the IF & FIFO circuitry (780) may be used for further cleaning up the test signal samples between the (775) and the second low-pass filter (785) as in the first and second embodiments.

The implementation alternatives of the functionality (equivalent equation) of the test signal offset zeroing circuitry (775) and the sensitivity compensation circuitry (790) disclosed in connection to the first embodiment are equally applicable in the second and third embodiments.

As disclosed above in connection to FIGS. 5 and 6, value of the gain coefficient K0 does not vary significantly from device to device of the same MEMS gyroscope product. In practice this enables defining experimentally a gain coefficient K0 for each type of MEMS gyroscope product that may be utilized for all similar devices. According to one embodiment, a single gain coefficient K0 may be defined on basis of device life-time test results performed for a plurality of similar gyroscope devices. In some cases, the gain coefficient K0 may be defined such that it depends on temperature.

The other comparison parameter used in the sensitivity compensation that needs to be defined is the reference value $V_{TEST}$. Because physical characteristics of MEMS devices, including MEMS gyroscopes, tend to vary significantly from device to device due to manufacturing tolerances, each MEMS gyroscope needs to be trimmed. The reference value $V_{TEST}$ to be used for sensitivity compensation may be defined for each device during the trimming process and stored into a memory, and used consequently for resolving a multiplier or a divider to be used for compensating the raw angular rate signal (78) sensitivity drift.

Although the compensation principle has been described above primarily in connection with a closed-loop gyroscope, it is equally applicable to an open-loop gyroscope.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A method for compensating drift of sensitivity of a MEMS gyroscope, the method comprising:
   feeding, into a sense part of a sensor element of the MEMS gyroscope, a force feedback signal comprising a test signal, wherein the test signal comprises at least one test frequency;
   obtaining an angular rate signal from the sense part of the sensor element;
   demodulating the angular rate signal with an in-phase carrier signal for producing a raw rate signal, wherein the angular rate signal comprises a test signal component comprising the at least one test frequency, and wherein the at least one test frequency deviates from a nominal frequency of the MEMS gyroscope;
   obtaining a DC test signal by processing the angular rate signal, wherein the processing the angular rate signal comprises:
      if the test signal component comprises an amplitude modulated test signal comprising at least two test frequencies, performing steps of:
      a) demodulating the angular rate signal using a quadrature-phase carrier signal, and
      b) multiplying the demodulated angular rate signal with a test carrier signal for obtaining the DC test signal; or
      if the test signal component includes a single test frequency, performing step:
      a) multiplying the angular rate signal with a test carrier signal for obtaining the DC test signal,
   or
   obtaining a DC test signal by further processing the raw rate signal, wherein the further processing the raw rate signal comprises:
      multiplying the raw rate signal with a test carrier signal for obtaining the DC test signal;
   wherein the method also comprises:
   low pass filtering the DC test signal to remove spurious signal components with higher frequencies for obtaining a raw test signal;
   zeroing offset of the raw test signal by comparing each sample of the raw test signal to a test signal normalization value for producing an offset zeroed test signal representing a deviation of the sample of the raw test signal from the test signal normalization value, wherein the test signal normalization value refers to a value of the test signal at a known condition;
   determining a sensitivity compensation multiplier on basis of the offset zeroed test signal and a predefined gain coefficient; and
   multiplying the raw rate signal with the sensitivity compensation multiplier for providing a sensitivity compensated rate signal.

2. The method according to claim 1, wherein the sensitivity compensation multiplier is defined by equation $$\frac{1}{1-((V_{TEST\_COMP}-V_{TEST}(i))/V_{TEST\_COMP})*K0}$$

or by equivalent equation $$\frac{1}{1-(V_{TEST\_COMP}-V_{TEST}(i))*K0/V_{TEST\_COMP}}$$

wherein $V_{TEST\_COMP}$ is the test signal normalization value, $V_{TEST}(i)$ is the current sample of the raw test signal, $((V_{TEST\_COMP}-V_{TEST}(i))/V_{TEST\_COMP})$ or $(V_{TEST\_COMP}-V_{TEST}(i))$ is the respective offset zeroed test signal and K0 is the predefined gain coefficient.

3. The method according to claim 1, further comprising low pass filtering the offset zeroed test signal for limiting bandwidth of the offset zeroed test signal before determining the sensitivity compensation multiplier.

4. The method according to claim 1, further comprising:
comparing each sample of the offset zeroed test signal to an offset threshold value; and
   discarding the sample when the offset is equal to or greater than the offset threshold value; or
   adding the sample to a first-in-first-out queue when the offset is less than the offset threshold value and using samples in the first-in-first-out queue as the offset zeroed test signal.

5. The method according to claim 1, further comprising:
phase trimming the quadrature-phase carrier signal for mitigating effects of phase shift of the at least one test frequency in the MEMS gyroscope; and
using the phase-trimmed quadrature-phase carrier signal for demodulation in the step a).

6. The method according to claim 1, the method further comprising:
demodulating the angular rate signal using the quadrature-phase carrier signal for producing a quadrature control signal.

7. The method according to claim 1, further comprising:
low pass filtering the sensitivity compensated rate signal for producing a continuous sensitivity compensated rate signal.

8. A MEMS gyroscope configured to compensate drift of the MEMS gyroscope's own sensitivity, the MEMS gyroscope comprising:
a backend circuitry configured to feed, into a sense part of a sensor element of the MEMS gyroscope, a force feedback signal comprising a test signal, wherein the test signal comprises at least one test frequency;
a circuitry configured to obtain an angular rate signal form the sense part of the sensor element;
a first demodulator configured to demodulate an angular rate signal with an in-phase carrier signal for producing a raw rate signal, wherein the angular rate signal comprises a test signal component comprising at least one test frequency, and wherein the at least one test frequency deviates from a nominal frequency of the MEMS gyroscope;
i) a circuitry configured to process the angular rate signal, wherein
   if the test signal component comprises an amplitude modulated test signal comprising at least two test frequencies, the circuitry configured to process the angular rate signal comprises:
a) a second demodulator configured to demodulate the angular rate signal using a quadrature-phase carrier signal; and
b) a first multiplier configured to multiply the demodulated angular rate signal with a test carrier signal for obtaining a DC test signal; or
   if the test signal component includes a single test frequency, the circuitry configured to process the angular rate signal comprises:
a) a first multiplier configured to multiply the angular rate signal with a test carrier signal for obtaining the DC test signal;

or
   ii) a circuitry configured to further process the raw rate signal, the circuitry configured to further process the raw rate signal comprising a first multiplier configured to multiply the raw rate signal with the test carrier signal for producing the DC test signal;
wherein the MEMS gyroscope also comprises:
   a first low-pass filter configured to filter the DC test signal to remove spurious signal components with higher frequencies for obtaining the raw test signal;
   an offset zeroing circuitry configured to zero offset of the raw test signal by comparing each sample of the raw test signal to a test signal normalization value for producing an offset zeroed test signal representing a deviation of the sample of the raw test signal from the test signal normalization value, wherein the test signal normalization value refers to a value of the test signal at a known condition; and
   a sensitivity compensation circuitry configured
      to determine a sensitivity compensation multiplier on basis of the offset zeroed test signal and a predefined gain coefficient; and
      to multiply the raw rate signal with the sensitivity compensation multiplier for providing a sensitivity compensated rate signal.

9. The MEMS gyroscope according to claim 8, wherein the sensitivity compensation multiplier is defined by equation $$\frac{1}{1-((V_{TEST\_COMP}-V_{TEST}(i))/V_{TEST\_COMP})*K0}$$

or by equivalent equation $$\frac{1}{1-(V_{TEST\_COMP}-V_{TEST}(i))*K0/V_{TEST\_COMP}}$$

wherein $V_{TEST\_COMP}$ is the test signal normalization value, $V_{TEST}(i)$ is the current sample of the raw test signal, $((V_{TEST\_COMP}-V_{TEST}(i))/V_{TEST\_COMP})$ or $(V_{TEST\_COMP}-V_{TEST}(i))$ is the respective offset zeroed test signal and K0 is the predefined gain coefficient.

10. The MEMS gyroscope according to claim 8, further comprising a second low-pass filter configured to low-pass filter the offset zeroed test signal for limiting bandwidth of the offset zeroed test signal before determining the sensitivity compensation multiplier.

11. The MEMS gyroscope according to claim 8, further comprising:
an IF & FIFO circuitry configured to compare each sample of the offset zeroed test signal to an offset threshold value, to discard a sample when the offset is equal to or greater than the offset threshold value, and to add the sample to a first-in-first-out queue when the offset is less than the offset threshold value, wherein samples in the first-in-first-out queue are configured to be used as the offset zeroed test signal.

12. The MEMS gyroscope according to claim 8, further comprising:
a phase trimming circuitry configured to phase trim the quadrature-phase carrier signal for mitigating effects of phase shift of the at least one test frequency in the MEMS gyroscope, and to provide the phase phase-trimmed quadrature-phase carrier signal to the second demodulator.

13. The MEMS gyroscope according to claim 8, further comprising:
a third demodulator configured to demodulate the angular rate signal using the quadrature-phase carrier signal for producing a quadrature control signal.

14. The MEMS gyroscope according to claim 8, further comprising:
a second low-pass filter configured to low-pass filter the sensitivity compensated rate signal for producing a continuous sensitivity compensated rate signal.

* * * * *